(12) United States Patent
Kuo et al.

(10) Patent No.: US 7,710,771 B2
(45) Date of Patent: May 4, 2010

(54) METHOD AND APPARATUS FOR CAPACITORLESS DOUBLE-GATE STORAGE

(75) Inventors: Charles C. Kuo, Union City, CA (US); Tsu-Jae King Liu, Fremont, CA (US)

(73) Assignee: The Regents of the University of California, Oakland, CA (US)

( * ) Notice: Subject to any disclaimer, the term of this patent is extended or adjusted under 35 U.S.C. 154(b) by 178 days.

(21) Appl. No.: 11/890,674

(22) Filed: Aug. 7, 2007

(65) Prior Publication Data
US 2009/0010056 A1   Jan. 8, 2009

Related U.S. Application Data

(62) Division of application No. 10/463,215, filed on Jun. 16, 2003, now abandoned.

(60) Provisional application No. 60/428,088, filed on Nov. 20, 2002.

(51) Int. Cl.
*G11C 11/34* (2006.01)

(52) U.S. Cl. ............. 365/184; 365/185.02; 365/185.18; 365/185.24; 365/185.25; 365/185.28

(58) Field of Classification Search ................. 365/184, 365/185.02, 185.18, 185.24, 185.25, 185.28
See application file for complete search history.

(56) References Cited

U.S. PATENT DOCUMENTS

| | | | |
|---|---|---|---|
| 5,168,805 A | 12/1992 | Kasanami et al. | |
| 5,448,513 A | 9/1995 | Hu et al. | |
| 6,088,260 A | 7/2000 | Choi | |
| 6,413,802 B1 | 7/2002 | Hu et al. | |
| 6,441,436 B1 | 8/2002 | Wu et al. | |
| 6,458,638 B2 | 10/2002 | Kim | |
| 6,538,916 B2 * | 3/2003 | Ohsawa | 365/149 |
| 6,551,885 B1 | 4/2003 | Yu | |
| 6,617,651 B2 | 9/2003 | Ohsawa | |
| 6,750,487 B2 * | 6/2004 | Fried et al. | 257/270 |
| 6,778,424 B2 * | 8/2004 | Iwata et al. | 365/149 |
| 6,828,008 B2 * | 12/2004 | Gruber | 428/192 |
| 6,833,569 B2 * | 12/2004 | Dokumaci et al. | 257/250 |
| 6,965,147 B2 * | 11/2005 | Shino | 257/347 |
| 7,049,654 B2 * | 5/2006 | Chang | 257/316 |
| 7,061,050 B2 * | 6/2006 | Fazan et al. | 257/348 |
| 7,132,751 B2 * | 11/2006 | Chang | 257/758 |

(Continued)

FOREIGN PATENT DOCUMENTS

JP    02003078026 A  *  3/2003

OTHER PUBLICATIONS

S. R. Banna et al, "A Unified Understanding on Fully-Depleted SOI NMOSFET Hot-Carrier Degradation", *IEEE Transactions on Electron Devices*, vol. 45, No. 1, Jan. 1998, pp. 206-212.

(Continued)

*Primary Examiner*—Viet Q Nguyen
(74) *Attorney, Agent, or Firm*—Michaelson & Associates; Peter L. Michaelson; George Wolken, Jr.

(57) ABSTRACT

A method and/or system and/or apparatus for a dual gate, capacitor less circuit that can act as a state storage device. Further embodiments describe fabrication methods and methods of operation of such a device.

9 Claims, 9 Drawing Sheets

50nm DG-DRAM Array Cell Simulation Parameters

| | Program (0/1) | Hold | Read | Purge (dynamic) |
|---|---|---|---|---|
| Front Gate Voltage ($V_{gf}$): | 1V | 0V | 1V | 1V |
| Back Gate Voltage ($V_{gb}$): | -1V | -1V | -1V | 0V |
| Drain Voltage ($V_d$): | 0.5V/1.2V | 0.5V | 0.5V | 0.5V |
| Source Voltage ($V_s$): | 0V | 0.5V | 0V | 0V |

$t_{program} = 10ns$
$N_{body} = 10^{15} cm^{-3}$ (P-type)
$T_{oxf} = 40 Å$
$T_{body} = 100 Å$
$\tau_{electron} = 1\mu s$
$\phi_{front\ gate} = 4.17 eV$ (N+)

$t_{purge} = 10ns$
$N_{s/d} = 10^{20} cm^{-3}$ (N+)
$T_{oxb} = 60 Å$
$L_{gate} = 50nm$
$\tau_{hole} = 1\mu s$
$\phi_{back\ gate} = 5.25 eV$ (P+)

U.S. PATENT DOCUMENTS

| | | | |
|---|---|---|---|
| 7,256,459 B2 * | 8/2007 | Shino | 257/347 |
| 7,402,850 B2 * | 7/2008 | Bhattacharyya | 257/239 |
| 7,408,800 B1 * | 8/2008 | Braceras et al. | 365/154 |
| 7,514,748 B2 * | 4/2009 | Fazan et al. | 257/348 |
| 2002/0011670 A1 | 1/2002 | Higashi et al. | |
| 2002/0130341 A1 | 9/2002 | Horiguchi et al. | |
| 2002/0175375 A1 | 11/2002 | Kunikiyo | |
| 2002/0182801 A1 | 12/2002 | Shimazaki et al. | |

OTHER PUBLICATIONS

W. F. Brinkman et al, "The Future of Solid-State Electronics", *Bell Lab Technical Journal*, Autumn 1997, pp. 57-74.

A. Cataldo, "Intel does about-face on SOI, backs high-k dielectric", *EE TIMES*, Nov. 26, 2001, 3 pp., downloaded from www.eetimes.com/story/OEG20011126S0031.

M. Chan et al, "Recessed-Channel Structure for Fabricating Ultrathin SOI MOSFET with Low Series Resistance", *IEEE Electron Device Letters*, vol. 15, No. 1, Jan. 1994, pp. 22-24.

L. Chang, "Scaling Limits and Design Considerations for Double-Gate MOSFET's", *Research Project, University of California at Berkeley, Department of Electrical Engineering and Computer Sciences*, May 10, 2001, 33 pp.

L. Chang, "Industrial FinFET Fabrication using Standard Processing Tools", *The ERL Research Summary for 2002*, Ch. 10: Solid-State Devices (abstract), downloaded from: www.eecs.berkeley.edu/IRPO/Summary/02abstracts/leland.2.com, 1 pg.

X. Huang et al, "Sub-50 nm P-Channel FinFET", *IEEE Transactions on Electron Devices*, vol. 48, No. 5, May 2001, pp. 880-886.

K. Hui et al, "Body Self Bias in Fully Depleted and Non-Fully Depleted SOI Devices", *1994 IEEE International SOI Conference Proceedings*, Oct. 3-6, 1994, pp. 65-66.

H. L. Kalter et al, "A 50-ns 16-Mb DRAM with a 10-ns Data Rate and On-Chip ECC", *IEEE Journal of Solid-State Circuits*, vol. 25, No. 5, Oct. 1990, pp. 1118-1127.

C. Kuo et al, "A Capacitorless Double-Gate DRAM Cell", *IEEE Electron Device Letters*, vol. 23, No. 6, Jun. 2002, pp. 345-347.

D. Lammers, "CPU vendors split over SOI", *EE TIMES*, Jun. 21, 2000, 4 pgs.

M. A. Mendicino et al, "Better models, production methods expand SOI applications", *EEdesign*, Sep. 23, 2002, 2 pps, downloaded from: www.eedesign.com/story/OEG20020923S0063.

D. Munteanu, "Generation-Recombination Transient Effects in Partially Depleted SOI Transistors: Systematic Experiments and Simulations", *IEEE Transactions of Electron Devices*, vol. 45, No. 8, Aug. 1998, pp. 1678-1683.

T. Ohsawa et al, "Memory Design Using One-Transistor Gain Cell on SOI", *IEEE International Solid-State Circuits Conference, ISSCC 2002/Session 9/DRAM and Ferroelectric Memories/9.1*, Feb. 5, 2002, 11 pgs.

S. Okhonin et al, "A SOI Capacitor-less 1T-DRAM Concept", *2001 IEEE International SOI Conference*, Oct. 2001, pp. 153-154.

Oki Electric Industry Co., Ltd., "Oki Ships World's First Commercial, Fully Depleted SOI LSIs", Mar. 11, 2004, 2 pp., downloaded from www.oki.com/en/press/2002/z01114e.com.

B. Pejcinovic, "EE 513 Solid-State Electronics III Ocate EE 510SC: High-Speed Semiconductor Devices", Mar. 11, 2004, 2 pp., downloaded from: www.eee.pdx.edu/~brano/ee513/ee513.com.

K. Shepard, "Design and CAD issues for Digital integrated circuits in PD-SOI technology", Mar. 11, 2004, 2 pp., downloaded from: www.cisl.columbia.edu/projects/soi/.

S. Sowah, "Floating-body effect points to denser memory cell", *EE TIMES UK*, May 5, 2002, 1 pg., downloaded from: www.electronicstimes.com/story/OEG20020503S0031.

T. Tanzawa et al, "A Compact On-Chip ECC for Low Cost Flash Memories", *IEEE Journal of Solid-State Circuits*, vol. 32, No. 5, May 1997, pp. 662-669.

Y. Taur, "An Analytical Solution to a Double-Gate MOSFET with Undoped Body", *IEEE Electron Device Letters*, vol. 21, No. 5, May 2000, pp. 245-247.

T. Tsuchiya et al, "Hot-Carrier-Induced Degradation in Ultra-Thin, Fully-Depleted, Deep-Submicron NMOS and PMOS SOI Transistors", *1994 IEEE International Reliability Physics Proceedings*, Apr. 12-14, 1994, pp. 57-64.

H. J. Wann et al, "A Capacitorless DRAM Cell on SOI Substrate", *IEEE International Electron Devices Meeting*, Dec. 5-8, 1993, pp. 635-638.

H. -S.P. Wong, "Beyond the conventional transistor", *IBM J. Res. & Dev.*, vol. 46, No. 2/3, Mar./May 2002, pp. 133-168.

Y. Zhang et al, "Abnormal transconductance and transient effects in partially depleted SOI MOSFETs", *Solid-State Electronics*, vol. 43, 1999, pp. 51-56.

* cited by examiner

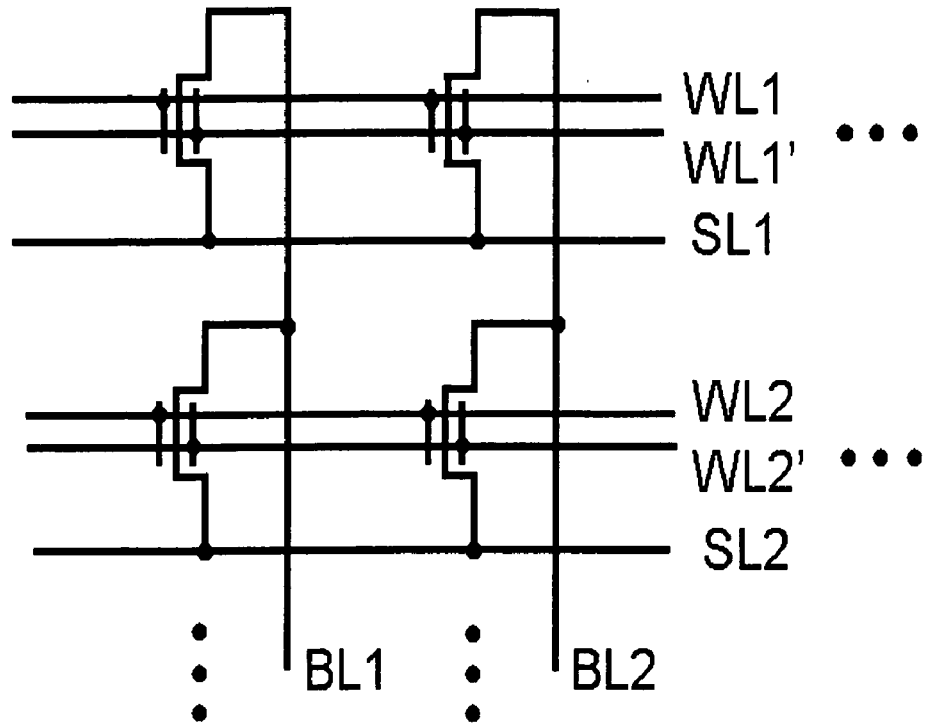

FIG. 3

50nm DG-DRAM Array Cell Simulation Parameters

|  | Program (0/1) | Hold | Read | Purge (dynamic) |
| --- | --- | --- | --- | --- |
| Front Gate Voltage ($V_{gf}$): | 1V | 0V | 1V | 1V |
| Back Gate Voltage ($V_{gb}$): | -1V | -1V | -1V | 0V |
| Drain Voltage ($V_d$): | 0.5V/1.2V | 0.5V | 0.5V | 0.5V |
| Source Voltage ($V_s$): | 0V | 0.5V | 0V | 0V |

$t_{program}$ = 10ns
$N_{body}$ = $10^{15}$cm$^{-3}$ (P-type)
$T_{oxf}$ = 40Å
$T_{body}$ = 100Å
$\tau_{electron}$ = 1µs
$\phi_{front\,gate}$ = 4.17eV (N+)

$t_{purge}$ = 10ns
$N_{s/d}$ = $10^{20}$cm$^{-3}$ (N+)
$T_{oxb}$ = 60Å
$L_{gate}$ = 50nm
$\tau_{hole}$ = 1µs
$\phi_{back\,gate}$ = 5.25eV (P+)

FIG. 4

METHOD AND APPARATUS FOR CAPACITORLESS DOUBLE-GATE STORAGE

This application is a divisional of, and claims the benefit of, our United States application entitled "Method and Apparatus for Capacitorless Double-Gate Storage" filed Jun. 16, 2003 and assigned Ser. No. 10/463,215, now abandoned, which claims priority from provisional patent application 60/428,088 filed Nov. 20, 2002. The entire contents of the aforesaid applications are incorporated herein by reference for all purposes.

FIELD OF THE INVENTION

The present invention is involved with electronic circuits and applications and method of manufacture and/or use thereof. More specifically, the invention in specific embodiments is involved with a capacitor-less double-gate DRAM and methods of use and manufacture thereof and systems incorporating a capacitor-less double-gate DRAM.

BACKGROUND

The discussion of any work, publications, sales, or activity anywhere in this submission, including in any documents submitted with or during examination of this application, shall not be taken as an admission by the inventors that any such work constitutes prior art. The discussion of any activity, work, or publication herein is not an admission that such activity, work, or publication was known in any particular jurisdiction.

The great majority of electronic devices in use today employ solid-state transistors as a chief building block. Dynamic random access memories (DRAM), in particular, play an increasingly important part in determining the performance of microelectronic products. Their role has raised the demand for reliable, high density memories with fast data access and low power consumption.

A typical and very well known DRAM design employs one transistor and one storage capacitor (1T/1C) per memory cell (or bit storage location) as well as other components to provide reference cells, sense amplification, refresh, redundancy, etc. However, the basic 1T/1C memory cell design has difficulties when shrunk, particularly below about 100 nm×100 nm cell size. Reducing the transistor's off-state leakage, for example, can require high substrate doping to sustain a large threshold voltage. Unfortunately, this approach often enhances trap-assisted tunneling and can lead to tail bits with small retention times. Another difficulty is fabrication of the small storage capacitor used in traditional DRAM designs.

There is substantial interest in developing the next generation DRAM. In some proposals for capacitorless DRAM going back as far as 1993, the conventional storage capacitor is replaced by the body capacitance of a SOI MOSFET (Silicon-On-Insulator Metal-Oxide-Semiconductor Field-Effect-Transistor). In some of these proposals, the number of majority carriers stored in the body can affect channel conductivity. It has been proposed that this change in channel conductivity can be used to distinguish two states in a memory device. However, previous capacitorless cell designs may be impractical for manufacturing because of their doping profiles. (See, for example, H.-J. Wann and C. Hu, "A Capacitorless DRAM Cell on SOI Substrate", *IEDM*, 1993, pp. 635-8.) Other publications have discussed partially depleted SOI (PD-SOI) MOSFET as a possible successor to conventional 1T/1C DRAMs. In October 2001, Okhonin et al. reported experimental measurements using a PD-SOI MOSFET as a capacitorless DRAM cell. In February 2002, Ohsawa et al. presented the results of a working 512 kb DRAM array with capacitorless PD-SOI cells. However, PD-SOI-based capacitorless DRAMs are also generally less practical in sub-100 nm technologies because the heavy doping levels required to sustain an undepleted body incur dopant fluctuations across many cells in an array that can result in significant threshold voltage ($V_t$) variations for high density memory arrays.

Furthermore, as the device is scaled, capacitorless DRAM technologies using a partially-depleted film generally require increasingly larger amounts of body doping. Heavy doping limits depletion into the body from the gate, drain, and source for sub-100 nm devices. This presents additional challenges since a large body doping can result in trap-assisted tunneling and $V_t$ fluctuations. While dopant fluctuations may be tolerable for wider logic devices, substantial variations in threshold voltage are generally significant for high density arrays using small-geometry cells. This can be especially true for capacitorless DRAM arrays in which the difference in threshold voltages between two states can be only a few hundred millivolts.

U.S. Pat. No. 6,088,260 discusses a capacitorless memory with a relatively thicker silicon body to accommodate a source/drain junction that is not contacted with the buried oxide layer and wherein a purging region is needed to serve as a body contact, which may limit the ability to achieve very small cell sizes. The body in this structure is not truly floating as there is a contact to the body through the purge region.

SUMMARY

The present invention, according to specific embodiments, involves devices and/or methods providing a capacitorless double-gate DRAM (referred to herein as DG-DRAM). Various embodiments of the invention provide novel architectures for DG-DRAM cells, novel methods of operation, novel methods of fabrication, and/or novel designs and methods for systems incorporating a DG-DRAM device, such as memory arrays and other circuit systems. Contemplated applications range from commodity and embedded DRAM products to 1T-SRAM arrays.

According to further specific embodiments, the invention involves a method and strategy that can allow DRAM to be shrunk effectively past the 1-4 gigabit memory array generation. In further embodiments, the invention involves a method and/or configuration that facilitates embedding DRAM with complementary MOSFET (CMOS) logic in the same process.

According to further embodiments of the invention, a DG-DRAM cell according to the invention has one or more of the following additional advantages: (1) it can be scaled below a 100 nm×100 nm memory cell size; (2) it can be used to reduce $V_T$ fluctuations between different cells in a memory array due to process variations; (3) it can be embodied in memory cells that provide low voltage operation; (4) it allows fast sensing; (5) it provides small off-state leakage; (6) it can be embodied in a memory array that resists disturbs from nearby memory cells; (7) it has long retention times (8) it can be constructed in a compact $4F^2$ cell size; (9) it can optionally be constructed using conventional semiconductor materials; and/or (10) it provides a memory cell design that can be extended to 3-D integration.

Unlike the problems with previous approaches, dopant fluctuations can be effectively suppressed in a DG-RAM array according to specific embodiments of the present invention by using either an undoped or very lightly doped silicon film as the body material for memory cells in the array.

Techniques for and characterization of such a lightly doped silicon film may be further understood from reference to Y. Taur, "An Analytical Solution to a Double-Gate MOSFET with Undoped Body", *Electron Device Letters*, May 2000, pp. 245-7 and C. Hu, "Silicon Nanoelectronics for the 21st century", *Nanotechnology*, no. 10, 1999, pp. 113-6. Undoped films are preferred, but lightly doped films can effectively suppress $V_T$ variations caused by random dopant fluctuations if the body's depletion charge within an array cell is negligible, which is the case for body concentration and silicon body thickness less than or on the order of approximately $10^{16}$ cm$^{-3}$ and 100 A, respectively.

Unlike previously reported PD-SOI DRAM cells, the charge carriers in the body in DG-DRAM are electrically induced when a negative back gate bias is used. Thus, the charge carriers in the body of a DG-DRAM according to specific embodiments of the present invention may at times be referred to as comprising an electrically induced floating body. During programming, a backgate bias allows carriers (e.g., holes) generated from impact ionization near the drain to collect inside the body, generally regardless of the body's doping concentration and/or in lightly doped or undoped bodies. According to specific embodiments of the present invention, the amount of carriers trapped within an otherwise fully-depleted body is used to distinguish two states in DG-DRAM.

According to further specific embodiments of the present invention, a DG-DRAM cell can combine a front gate oxide thickness that is thicker than a conventional logic MOSFET and a thin silicon body to achieve large gains in threshold voltage for small additions in body potential. In other words, a DG-DRAM according to specific embodiments of the present invention can be made to have a large body coefficient ($dV_t/dV_{bs}$>1). This large gain in threshold voltage is achieved even at sub-100 nm gate lengths because the thin body, double-gate structure of DG-DRAM effectively terminates electric field lines from the drain, allowing slightly thicker gate oxides to be used. Moreover, the use of thicker gate oxides is helpful in minimizing hole gain and loss in the body from leakage through the gate dielectric.

DG-DRAM's structure according to specific embodiments of the invention is easily integrated in an embedded process using double-gate and/or thin-body logic transistors, such as discussed in the *International Technology Roadmap for Semiconductors*, 2001. In this case, the difficulties that would appear in merging CMOS logic and 1T/1C DRAM technologies—such as the compatibility of the thermal budget and surface planarity between logic and memory—are eliminated. With additional processing steps, DG-DRAM can also be integrated with bulk and PD-SOI CMOS logic.

DG-DRAM's unique structure according to specific embodiments of the present invention permits off-state leakage and array disturb problems to be minimized while simultaneously sustaining a large body coefficient as the memory cell is scaled below 100 nm×100 nm. In contrast to some other proposals, DG-DRAM purposely uses a thin body to achieve large body coefficient, long retention time, and good disturb behavior at sub-100 nm gate lengths. Furthermore, no purging region is needed in DG-DRAM structure; allowing for a smaller cell size. According to specific embodiments of the present invention, because the body is so thin, DG-DRAM uses a destructive read and requires refreshing after each read operation. These and other features and benefits according to specific embodiments of the invention are further discussed below.

OTHER FEATURES & BENEFITS

The invention and various specific aspects and embodiments will be better understood with reference to the following drawings and detailed descriptions. For purposes of clarity, this discussion refers to devices, methods, and concepts in terms of specific examples. However, the invention and aspects thereof may have applications to a variety of types of devices and systems. It is therefore intended that the invention not be limited except as provided in the attached claims.

Furthermore, it is well known in the art that logic system components and methods can include a variety of different components and different functions in different embodiments. For purposes of clarity, the invention is described in terms of embodiments that include many different innovative components and innovative combinations of innovative components and known components. No inference should be taken to limit the invention to combinations containing all of the innovative components listed in any illustrative embodiment in this specification.

All references, publications, patents, and patent applications cited herein and/or submitted with any attached Information Disclosure Statement (IDS) are hereby incorporated by reference in their entirety for all purposes.

BRIEF DESCRIPTION OF THE DRAWINGS

FIG. 3 is a block diagram illustrating a portion of an example memory array showing four cells according to specific embodiments of the present invention.

FIG. 4 provides example operating parameters for an example DG-DRAM cell according to specific embodiments of the invention.

DETAILED DESCRIPTION OF SPECIFIC EMBODIMENTS

Figure 1:
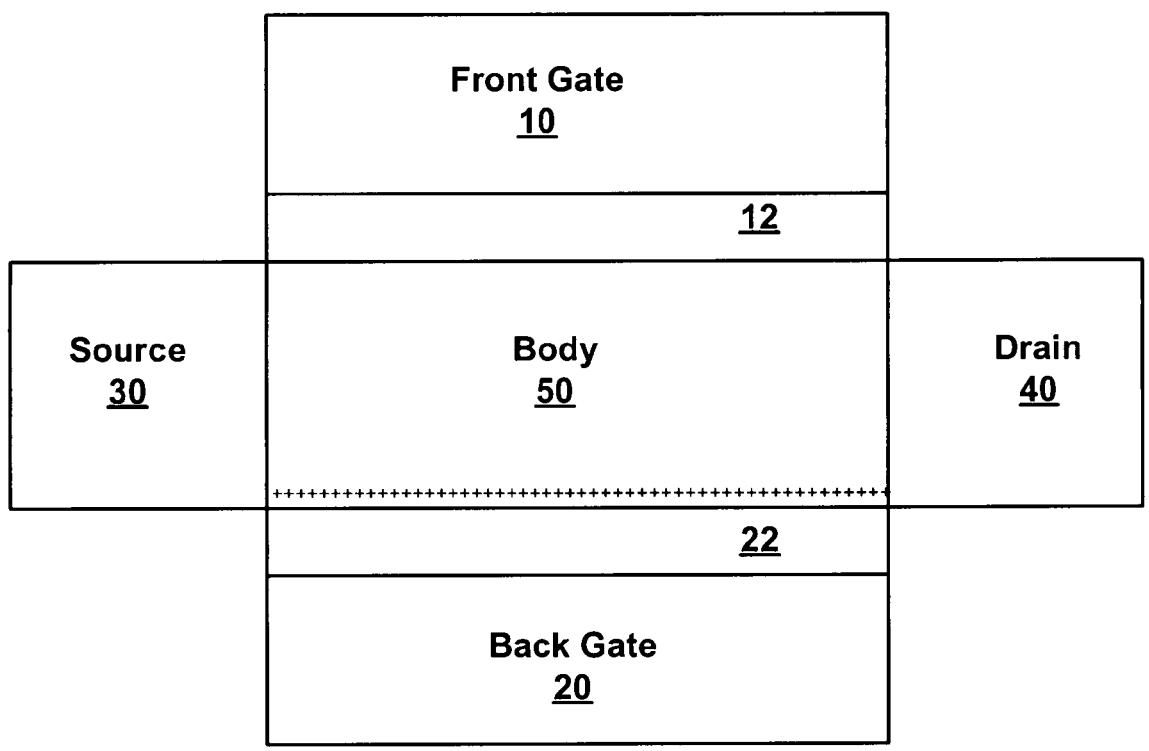
FIG. 1 is a block diagram illustrating an example capacitor-less double-gate DRAM cell according to specific embodiments of the present invention.

Before describing the present invention in detail, it is to be understood that this invention is not limited to particular compositions or systems, which can, of course, vary. It is also to be understood that the terminology used herein is for the purpose of describing particular embodiments only, and is not intended to be limiting. As used in this specification and the appended claims, the singular forms "a," "an" and "the" include plural referents unless the content and context clearly dictates otherwise. Thus, for example, reference to "a device" includes a combination of two or more such devices, and the like.

Unless defined otherwise, all technical and scientific terms used herein have meanings as would commonly be understood by one of ordinary skill in the art to which the invention pertains. Although any methods and materials similar or equivalent to those described herein can be used in practicing or for testing the present invention, preferred materials and methods are described herein.

In describing and claiming the present invention, the following terminology will be used generally in accordance with the definitions set out below, unless the context requires otherwise.

The term "electrically coupled" when used with reference to regions as discussed herein refers to an association between regions such that electrons and holes can move between regions under appropriate conditions. Electrical coupling can include direct connection and/or indirect connections through some spacing or semiconductance region. There also need not necessarily be any contact between the electrode/channel and the coupled region where the electrode or gate is sufficiently close to the storage medium/molecule so that a field applied will cause an electric effect in the coupled region.

A "substrate" is a, preferably solid, material suitable for the attachment or arrangement of one or more further circuit elements as discussed herein. Substrates can be formed of materials including, but not limited to glass, plastic, silicon, germanium, minerals (e.g. quartz), semiconducting materials (e.g. doped silicon, doped germanium, etc.), ceramics, metals, etc.

1. Overview

The present invention, according to specific embodiments, involves a capacitorless, double-gate DRAM (DG-DRAM) cell. In further embodiments, the invention involves use of such a cell in applications ranging from commodity and embedded DRAM products to 1T-SRAM arrays.

In general terms and in specific embodiments, differences between DG-DRAM and other proposals for capacitorless RAM include the greater scalability of memory cells constructed in accordance with the teachings provided herein; DG-DRAM according to specific embodiments of the present invention generally uses relatively simple P/N junctions across the device length. It is generally difficult to form the heavily doped junctions (for example, N++/P+) that other proposals call for, particularly for thin (~100 Å) films; moreover N++/P+ junctions will incur more band-to-band tunneling leakage which generally is a problem for low power applications; the thin body, thick oxide in DG-DRAM according to specific embodiments of the present invention provides a large body coefficient; whereas in other proposals, the area opposite the front gate of the body is generally either grounded or floating, in DG-DRAM according to specific embodiments of the present invention, this "substrate" area is where the back gate is placed and therefore a controllable voltage can be placed on this area; in part as a result, off-state leakage will be more of a problem in some other proposals because there is no discrete back gate that closely couples to the back interface of the body.

2. Basic Structure

Operational components of a compact, double-gate structure of a DG-DRAM according to specific embodiments of the present invention are illustrated in the block diagram of FIG. 1. FIG. 1 illustrates back gate region 20 on one side of body region 50, front gate region 10 on the opposite side of the body region, drain region 40 and source region 30 that are generally electrically coupled with the body region. These regions, as will be understood in the art, are areas of an electrical circuit device formed using any appropriate circuit fabrication process. As will be further understood in the art, the circuit is generally constructed so that in normal operation little or no current will flow between either of the gates and the body region 50. This is typically accomplished using an insulating layer, such as, for example, front oxide layer 12 and back oxide layer 22. Body region 50 according to specific embodiments of the present invention generally is not in direct electrical contact with an underlying substrate or any electrical signal lines. In operation, the other four regions typically have electrical connections for applying or detecting electrical signals as discussed herein.

The following describes operation of a circuit such as shown in FIG. 1, using an example of a negative back gate voltage and hole generation into the body region. It will be understood in the art that various voltages and/or doping polarities can be reversed in specific embodiments, providing, for example, electron generation and electrons in the body acting as majority carriers.

According to specific example embodiments of the present invention, when a negative back gate voltage is applied at back gate 20, potential barriers at the back interface (e.g., the interface between back gate 20 and body 50) are raised. This causes any excess carriers (e.g., holes) present or introduced into the body to be held for a time, even in a partially-depleted and/or fully depleted and/or undoped and/or lightly doped body. These held excess carriers can also be referred to herein and understood as an electrically induced floating body.

In operation, excess carriers (e.g., holes) can be generated by impact ionization near the drain during a programming event (e.g., writing a "0" or a "1") by application of a drain voltage. The number of excess carriers generated is determined by the programming event drain voltage (e.g., a drain voltage of 0.5 V to write a "0" or a drain voltage of 1.2 V to write a "1"). Excess carriers in body 50 collect at the back interface because of the potential applied to the back gate and change the drain current for a given drain voltage. The difference in drain current is detected to determine the state of the last programming event or, in other words, the bit stored by the memory cell.

Thus, a transistor type circuit as shown in FIG. 1 can be used as a capacitorless double-gate DRAM cell. This basic design can in specific embodiments be shrunk effectively down past 1-4 gigabit memory device arrays and can be embedded in integrated circuits with complementary MOSFET (CMOS) logic in the same process.

Unlike the problems with previous approaches, dopant fluctuations inherent in many doping fabrication techniques can be effectively avoided by using either an undoped or very lightly doped silicon film from which body 50 is defined. For example, in DG-DRAM cells with an undoped body, $V_T$ variation due to random dopant fluctuations can be completely eliminated from consideration.

According to further specific embodiments, a DG-DRAM of the present invention can be easily integrated in an embedded process using double-gate and/or thin-body logic transistors, such as discussed in, for example, *International Technology Roadmap for Semiconductors*, 2001. In this case, the difficulties that can arise in merging CMOS logic and 1T/1C DRAM technologies, for example the compatibility of the thermal budget and surface planarity between logic and memory, are eliminated or substantially reduced. In further embodiments, using additional processing steps, a DG-DRAM can be integrated with bulk and PD-SOI CMOS logic as known in the art and/or discussed in references mentioned herein.

Electrically Induced Floating Body

Operation of a circuit as shown used in FIG. 1 is at times described herein as involving an electrically induced floating body. This term is chosen somewhat in contrast to the term "floating body" used to indicate trapped carriers induced by doping profiles in other SOI-type circuits. In SOI, it has long been known that one problem that can affect transistor behavior is the floating body effect. In typical PD-SOI, a partially depleted body region is isolated from a substrate by an insulating layer, such as a buried oxide. Since no contact is explicitly made to the body, it is floating with respect to ground and majority carriers can remain in this region and affect transistor operation.

In SOI, the floating body effect has long been considered a problem that can affect transistor behavior. In particular, the floating body effect was discussed as adding an undesired historical behavior to transistor operation, because the number of carriers available in the body which contribute to the effect were based on previous operating states of the transistor.

As discussed above, some other capacitorless DRAM cells proposed using PD-SOI and using the floating body effect for memory storage. However, these proposals use doping profiles that are undesirable for a number of reasons (such as random dopant fluctuations and excessive band to band tunneling) and may be difficult to realize for cells with sub-100 nm gate lengths and/or small silicon film thicknesses.

In other capacitorless proposals, the device's threshold voltage can be modeled in a similar manner as an EPROM and the sheet of storage charge in the storage node acts as a quasi-floating gate. In DG-DRAM, the back gate is used to store charge at the interface and modulates the threshold voltage through the body effect. One advantage over some other proposals that use the body effect is that a DG-DRAM according to specific embodiments of the present invention is scalable for sub-100 nm feature sizes.

In general, FD-SOI (Fully Depleted Silicon On Oxide) devices do not necessarily have any excess charge within the body region to act as floating body charge. However, according to specific embodiments of the present invention, charge injected into or generated within a FD body can be held near a back gate by applying a back gate potential voltage. Thus, according to specific embodiments of the present invention, a FD body that does not have an electrical connection to an underlying substrate, for the most part remains fully depleted, but charge injected into or generated within the body can collect along the interface with a back gate due to an applied back gate potential. Thus, this charge is at times referred to herein as an electrically induced floating body.

The body coefficient ($dV_t/dV_{bs}$) of a device according to specific embodiments of the present invention can be generally understood from MOSFET body coefficient equation, which typically is defined as:

$$\frac{dV_t}{dV_{bs}} = \frac{dV_t}{dV_{gf}} \times \frac{dV_{gf}}{dQ_{inv}} \times \frac{dQ_{inv}}{dV_{bs}} \quad (1)$$

$$= -\frac{C_{Si}}{C_{oxf}}$$

$$= -\frac{3T_{oxf}}{T_{Si}}$$

where $V_t$ is the threshold voltage during a read operation, according to specific embodiments of the present invention $V_{bs}$ is the electrically induced floating body potential, $V_{gf}$ is the front gate voltage, $Q_{inv}$ is the inversion layer charge density, $T_{oxf}$ is the front gate oxide thickness, $C_{oxf}=\epsilon_{ox}/T_{oxf}$, and $C_{Si}=\epsilon_{Si}/T_{Si}$.

Because a thin body, double-gate device effectively terminates field lines from the drain, a slightly thicker gate oxide may be used in a DG-DRAM cell according to specific embodiments of the present invention while generally avoiding punchthrough and excessive off-state leakage. By combining a small silicon film thickness from which the body is formed and thick gate oxide into one device, DG-DRAM according to specific embodiments of the present invention can transform small gains in body potential into larger changes in $V_t$.

According to specific embodiments of the present invention, a DG-DRAM can also be realized with thicker, fully-depleted silicon films. Unfortunately, a thicker body in sub-100 nm devices increases off-state leakage. Using a more negative back gate voltage ($V_{gb}$) raises $V_t$ and reduces leakage. This approach also compensates for the smaller body coefficient by permitting additional holes to be stored within the body. However, raising $|V_{gb}|$ increases the electric field at the junctions and can lead to more trap-assisted tunneling in some implementations, which limits retention times in high density memory arrays. Thus, scaling DG-DRAM with a thicker, fully-depleted body may, in some situations, be less preferred than using a cell structure with a thinner film, but provides an alternative embodiment of the present invention.

3. Example Geometry

Figure 2:
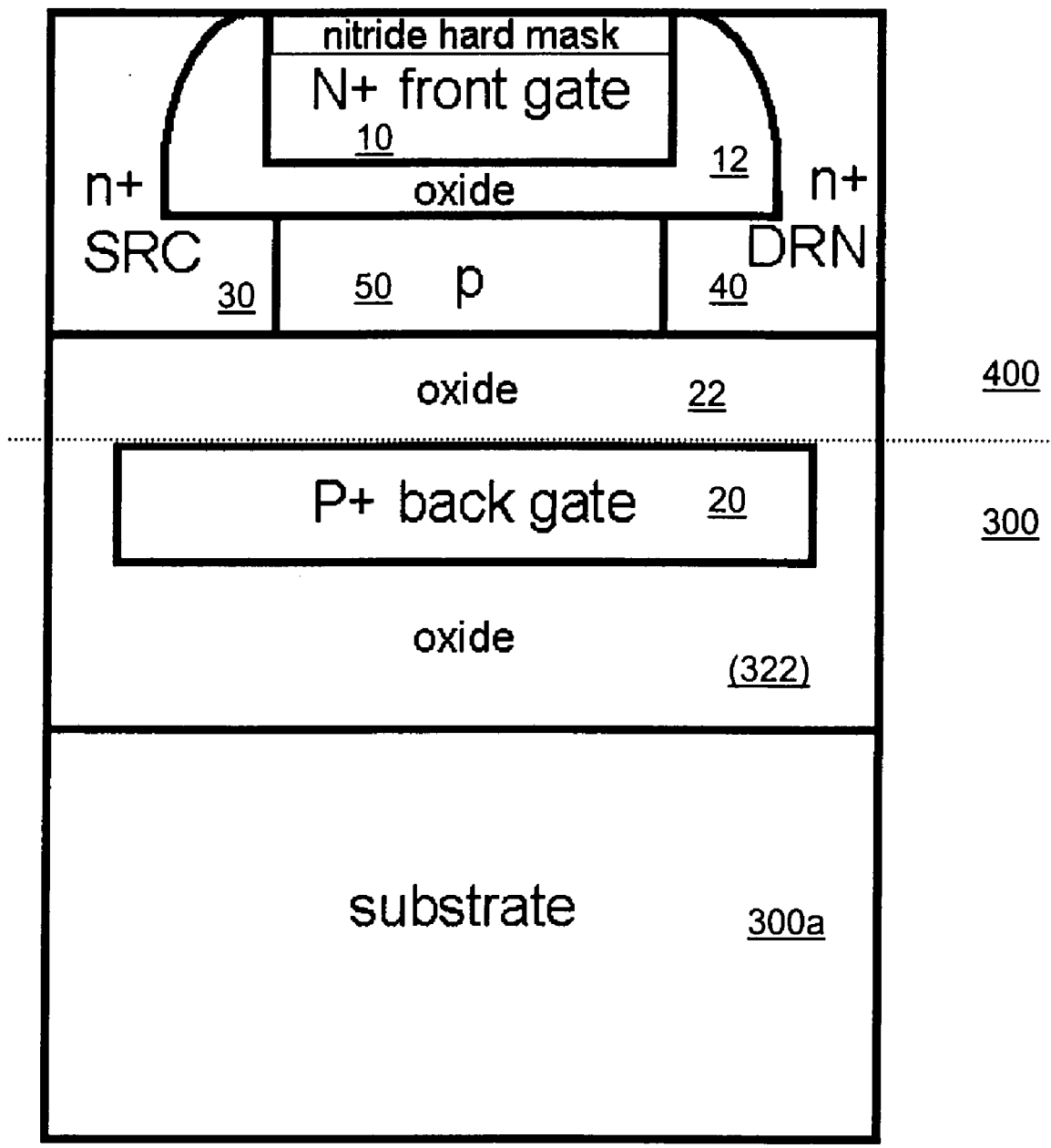
FIG. 2 is a block diagram illustrating a cross-section of a planar DG-DRAM cell according to specific embodiments of the present invention.

FIG. 2 is a block diagram illustrating a cross-section of a planar DG-DRAM cell according to specific embodiments of the present invention. In this example embodiment, raised source/drain (S/D) regions are used to minimize the S/D resistance in a DG-DRAM construction. The raised S/D regions allow for the peak ($R_p$) of an implanted ion species to be situated away from the channel (e.g., the body) during fabrication. A subsequent S/D drive-in diffusion step brings the S/D dopants to the channel region. By using this technique, implantation-induced defects caused by nuclear stopping at the implant peak $R_p$ can be situated far from the junction depletion region, resulting in less trap-assisted tunneling. This provides a memory array according to specific embodiments of the present invention with an improved distribution of tail bits.

According to specific embodiments of the present invention, a DG-DRAM's structure allows off-state leakage and array disturb problems to be minimized while simultaneously sustaining a large body coefficient, particularly as the memory cell is scaled below about 100 nm.

4. Fabrication

One example method for fabrication of a DG-DRAM cell according to specific embodiments of the present invention can be understood from further reference to FIG. 2. This cell may be used in specific embodiments to realize sub-100 nm×100 nm DG-DRAM array cells. In a particular process according to specific embodiments of the present invention, a thin back gate oxide 22 is thermally grown on a bulk silicon wafer substrate 300 followed by deposition of amorphous P+ (or, in an opposite polarity embodiment, N+) silicon. Note that an alternative dielectric material such as silicon nitride or a dielectric stack such as oxide/nitride could also be used to avoid problems such as boron penetration from the doped+ silicon layer into the body.

Shallow trench isolation (STI) is used to define a back gate 20 from this P+ silicon layer. The wafer is then bonded to a second oxidized silicon wafer 400. After a bonding anneal and front surface polishing, the wafer is oxidized to achieve a thin silicon film. The front gate oxide 12 is thermally grown, followed by the formation of a front gate 10, which is generally doped oppositely from the back gate. A nitride hard mask 324 can be constructed over the gate region to aid in polishing as will be understood from the art. Raised source 30 and drain 40 regions are formed using methods such as ion implantation and drive-in diffusion as are known in the art.

Note that the front gate length according to specific embodiments of the present invention can be shorter than the DRAM half-pitch. This results in a larger tolerance for aligning the two gates and contacting the source and drain regions. Increases in overlap capacitances between the back gate and the source and drain are not as significant as with logic transistors.

Note that a DG-DRAM according to specific embodiments of the invention can be constructed using conventional gate materials. In other embodiments, a DG-DRAM can also be constructed using other gate, dielectric, and body materials as well as other gate oxide thicknesses, body thicknesses, and operating voltages.

5. Example Array Structure

According to specific embodiments, the present invention involves a memory array using DG-DRAM cells as discussed above. In this embodiment, a number of cells as described above are arranged in an array allowing for addressing and access of the states stored in the cells. Memory arrays are well-known in the art and a variety of different memory array configurations and modes of operation can be used according to specific embodiments of the invention according to the invention.

In further embodiments, the invention involves a more particular memory array structure and/or mode of operation. This aspect of the invention is generally designed to be used with a DG-DRAM cell as described herein though it may be used with other analogous devices. FIG. 3 is a block diagram illustrating a portion of an example memory array showing four cells according to specific embodiments of the present invention.

The array structure of FIG. 3 is analogous to memory arrays familiar in the art and shows a portion of a memory array of four bits. However, in this structure, there are two Word Lines (e.g., WL1 and WL1'), which in each cell are connected to a front gate and a back gate as described above.

In specific embodiments, Source Lines (e.g., SL1 and SL2) in this array structure can be shared to achieve a compact $4F^2$ cell size in planar DG-DRAM array cells.

Subarray Blocks

Reading speeds depend in part on how quickly array cells drive low-capacitance nodes within current sense amplifiers as will be further understood from T. Blalock and R. Jaeger, "A High Speed Clamped Bitline Current Mode Sense Amplifier", *IEEE Journal of Solid State Circuits*, April 1991, pp. 542-8. While sensing signal margins are independent of bitline capacitance in DG-DRAM, the time it takes to switch bitline voltages between different operation modes can increase. This effect is reduced by dividing the array bits into small, discrete subarray blocks. Each bitline covers a limited number of cells which minimizes the overall bitline capacitance as discussed in K. Itoh, *VLSI Memory Chip Design*, Springer, New York, 2001.

6. Example Array and/or Cell Operation: Read, Program, Purge, and Hold

According to specific embodiments of the present invention, operation of such an array and/or of the cells therein can be understood as involving four operating states: Read, Program, Purge, and Hold. These operations have some general similarities to those of previously proposed devices and are further discussed below. FIG. 4 provides example operating parameters for an example DG-DRAM cell according to specific embodiments of the invention. These values are for purposes of example and have been used in a simulation circuit according to specific embodiments of the present invention but a variety of operation voltages are possible in various memory cells and/or systems constructed and/or operated in accordance with the teachings herein.

Program (or Write) Operation

Generally, the number of holes at the back interface of an N-channel DG-DRAM cell according to specific embodiments of the present invention determines the state of a bit stored in a memory cell. (Conversely, according to specific embodiments of the present invention, the number of electrons at the back interface of a P-channel DG-DRAM cell can be used to determine the state of a bit.) More holes correspond to larger drain currents which can be detected quickly by a current sense amplifier, as described in T. Blalock and R. Jaeger, "A High Speed Clamped Bitline Current Mode Sense Amplifier", *IEEE Journal of Solid State Circuits*, April 1991, pp. 542-8. According to specific embodiments of the present invention, to introduce holes into the body, impact ionization is used as will be understood to those of skill in the art from the teachings provided herein. Programming speeds of a few nanoseconds have been shown in previous devices to be able to fill the body with holes. Generally, because an entire wordline is programmed at one time, drain voltages (which are connected by bitlines, BLx) are varied to define the cell state. According to specific embodiments of the present invention, writing "1" and "0" states requires a large and small drain voltage respectively.

Generally in memory cells, as gate length scales downward, smaller drain voltages can be used to sustain a constant electric field during programming. In a DG-DRAM according to specific embodiments of the present invention, a large body coefficient allows even a small change in carrier concentration to effect a significant reduction in $V_t$ through $\Delta V_{bs}$. Since $\Delta V_{bs}$ is proportional to the change in carrier (e.g., hole) density, the total amount of carriers (e.g., holes) required to achieve the same change in body potential decreases for shorter channel lengths because the cell size is reduced.

Using Impact Ionization

It has previously been discussed to use impact ionization in analogous FET circuits. While hot carrier reliability in thin, sub-100 nm SOI MOSFETs remains an issue of research in the art, experimental data from longer FD-SOI transistor devices (e.g., $T_{ox}$=50 Å, $T_{Si}$=500 Å, L=0.1 µm) indicate that $V_t$ shifts of just 10 mV are possible with drain voltages around 2V for a 10 year lifetime as further discussed in T. Tsuchiya, T. Ohno, Y. Kado, and J. Kai, "Hot Carrier Induced Degradation in Ultrathin Fully Depleted SOI", *IRPS*, 1994, pp. 57-64. Experimental results as discussed below indicate that in specific embodiments, the invention can use impact ionization with moderate voltages to achieve fast programming times and good cell endurance simultaneously.

In experimental measurements, an RC-SOI simulation device operated according to specific embodiments of the present invention was cycled. Each cycle consists of a 50 ns purge pulse to expel holes from the body followed by a 10 ns programming pulse to introduce holes into the body. After $10^{11}$ cycles, there was an 8 mV increase in $V_t$ and no degradation in data retention. This indicates that in devices according to specific embodiments of the present invention it should be possible to use impact ionization with moderate voltages to achieve fast programming times and good cell endurance simultaneously.

Read

During a read, the state of a particular memory cell is determined as follows: the WL and WL' corresponding to the desired cell are brought to voltages such as those shown in FIG. 4. According to specific embodiments of the present invention, the WL and WL' lines are held at opposite voltages of roughly equal values, though other voltages levels are possible so long as there is a sufficient difference between WL and WL'. The SL corresponding to the desired cell is brought to an appropriate read value, such as 0 volts and the correct bit-line/drain voltage is held at a differential voltage, such as +0.5 volts. Again, these and other operating voltages herein are provided as specific examples according to specific embodiments of the present invention and a range of other voltages will be appropriate and/or required for other memory cells constructed in accordance with the teachings herein. Then, sense amplifiers or similar devices attached to the BL of the desired cell are activated and the sense amplifier compares drain current of an array bit to a reference current, such as from a reference cell. Note that with shared SLs, a number of bits are active and can be read at once.

Read Refresh

According to specific embodiments of the present invention, as is generally true with conventional 1T/1C DRAM cell, a refresh is required after every read operation. For a thin silicon body, increasing $V_{gf}$ reduces the source-body potential barrier at the back interface. This allows excess holes to diffuse from the body to the source. To maximize the current difference between two states, a small $V_{gf}$ and fast switching speeds can be used during a read operation to minimize the loss of excess holes when a programmed cell is turned on.

Handling $V_t$ Variations

Subarray Blocks

In many practical implementations, many variations in cell geometry due to manufacturing variations should be considered, because the $\Delta V_t$ between two states in some capacitor-less DRAM cells according to specific embodiments of the present invention are only a few hundred millivolts.

Although $V_t$ is sensitive to large variations in body thickness, fabricating a DG-DRAM array can be more tractable. For example, high density memory arrays are divided into small subarray blocks as will be further understood with reference to K. Itoh, *VLSI Memory Chip Design*, Springer, New York, 2001. Thus, rather than maintaining a strictly uniform body thickness across an entire wafer, a goal is to minimize intra-subarray variations in film thickness. This approach is desirable because array bits are compared to reference cells in the same block. Current sensing schemes help in this approach by canceling out systematic variations within the subarray as common mode noise, for example as may be further understood from T. Ohsawa, K. Fujita, T. Higashi, Y. Iwata, T. Kajiyama, Y. Asao, K. Sunouchi, "Memory Design Using One-Transistor Gain Cell on SOI", *ISSCC*, 2002, pp. 152-3.

Reducing Front Gate Oxide

A further technique for minimizing the effect (especially during read operations) of variations of $V_t$ is to reduce the front gate oxide thickness ($T_{oxf}$). The front gate oxide generally should not be thinned excessively for a given body thickness because of the decrease in the body coefficient. Holes would also spread over a larger area at the back interface because the front gate exercises better control of the potential profile, resulting in smaller gains in $\Delta V_{bs}$ for the same number of holes. However, the body coefficient is independent of the back gate oxide thickness ($T_{oxb}$). A thicker back oxide not only reduces overlap capacitance, but it also decreases coupling from the back gate to the front surface potential. This reduces the capacitor divider effect and the impact that body thickness variations have on $V_t$.

In simulations of an example method of operation according to specific embodiments of the present invention, simulation parameters of a DG-DRAM cell listed in FIG. 4 were chosen to reduce the $V_t$ dependence on gate length and body thickness as well as to attain a large body coefficient. Again, these parameters are only one example of operation parameters and other operating parameters will be desirable in specific devices built in accordance with the teachings of this invention depending on device size, materials chosen, desired operating characteristics, etc.

Purge

In specific constructions of a memory cell according to specific embodiments of the present invention, holes can accumulate within the body through thermal generation and tunneling of valence band electrons from the body into the S/D regions and as a result in specific embodiments, holes must be purged periodically in order to write a "0" state. According to specific embodiments of the present invention, this can be achieved by using a more positive $V_{gb}$ and/or $V_{gf}$. Larger gate voltages reduce the potential barrier at the body-source junction, allowing the lateral electric field to sweep accumulated holes into the source. According to specific embodiments of the present invention, a purge does not have to entirely remove the holes from the body. However, holes remaining in the body after a purge result in a smaller $V_t$ window between "1" and "0" states.

Figure 5:
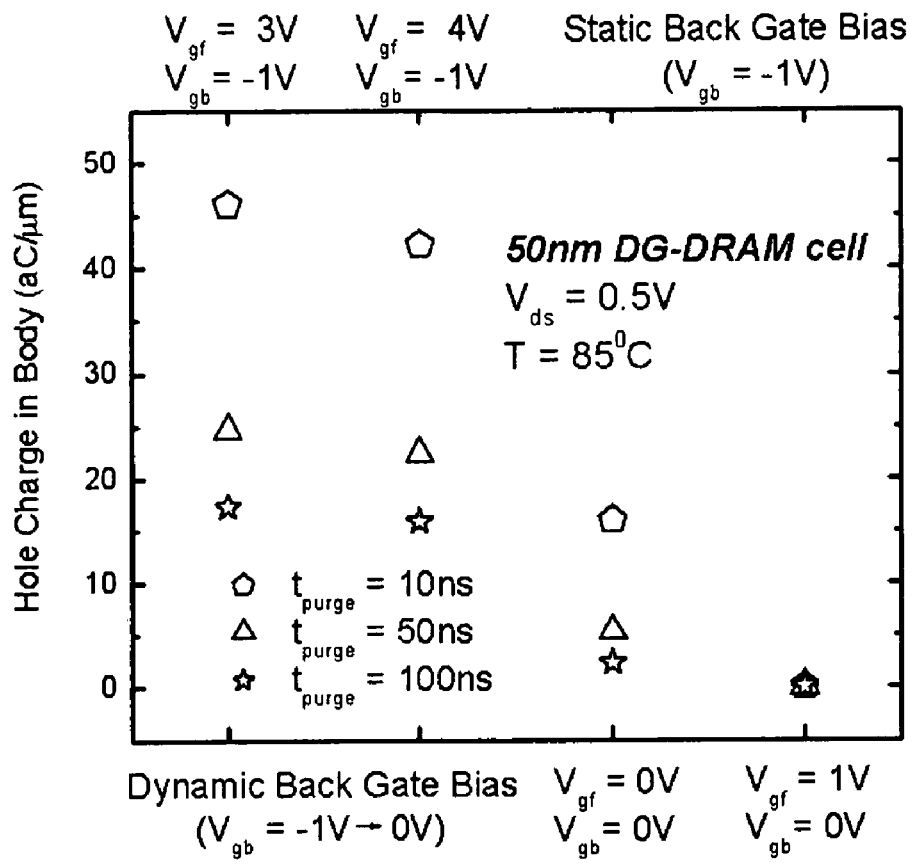
FIG. 5 illustrates an example operation in which a dynamic back gate purge is shown to more quickly expel hole charges from the body in an example DG-DRAM cell according to specific embodiments of the present invention.

In one embodiment, to quickly achieve a large sensing margin, a dynamic back gate bias works effectively to purge the body because of the close coupling between the potential profile at the back interface and the back gate. The use of a positive front gate voltage helps to further reduce the source-body barrier, allowing for faster purges. FIG. 5 illustrates an example operation in which a dynamic back gate purge is shown to more quickly expel hole charges from the body in an example DG-DRAM cell according to specific embodiments of the present invention.

Thus, in specific embodiments, a dynamic back gate purge can be used wherein back gate voltage changes to a more positive value to reduce the potential barrier between source and body and front gate voltage changes to a positive value to reduce the potential barrier between source and body wherein the source voltage may be grounded to reduce the potential barrier between source and body; it is possible also to keep the source at the same voltage as the drain and use only the front & back gate voltages to reduce the barrier between the body and source/drain regions.

In further specific embodiments, a dynamic back gate purge operation according to the invention follows a three step process: (i) reading data from cells in a wordline; (ii) using the dynamic back gate purge in cells along a wordline to expel charge carriers from the cell body; and (iii) writing data back to the cells in a wordline.

Static Purge

In an alternative embodiment, a static back gate purge can be accomplished by keeping a back gate voltage unchanged throughout all the device operation modes (i.e. read, purge, write, hold) and having the front gate voltage change a positive value to reduce the potential barrier between source and body where the source voltage can be grounded to further reduce this barrier. It is possible also to keep the source at the same voltage as the drain and use only the front gate voltage to reduce the barrier between the body and source/drain regions.

Figure 6:
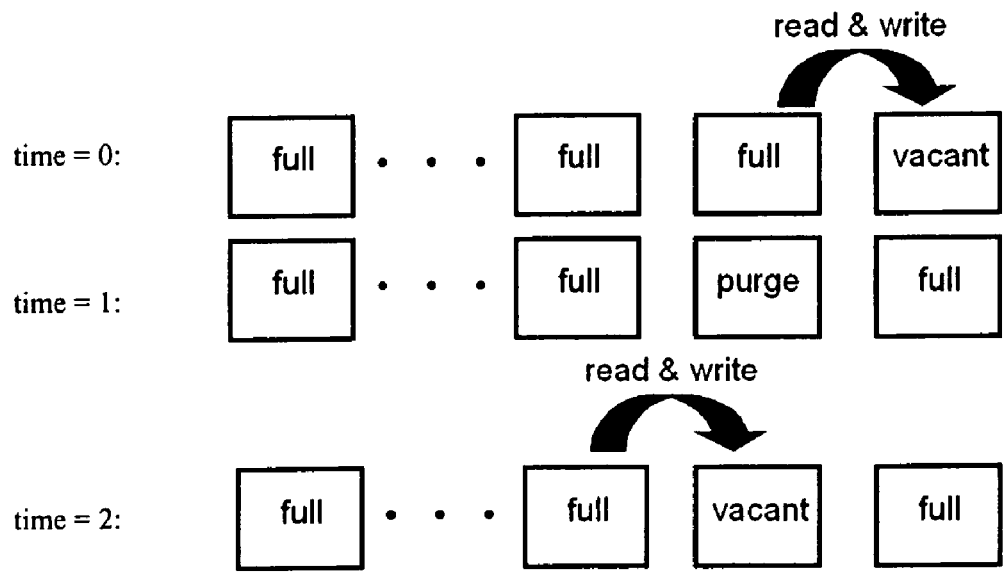
FIG. 6 illustrates example operation of a static back gate purge operation according to specific embodiments of the present invention.

Other details related to a static back gate purge operation according to specific embodiments of the present invention are illustrated in FIG. 6. As illustrated in this figure, one memory block is kept vacant; data from an adjacent block is read and copied into the vacant block. Once its data has been entirely read out and copied, all the bits in the block which has been read are now purged; the block then becomes vacant, ready to accept data from another block.

Hold Parameters and Characteristics

Figure 7:
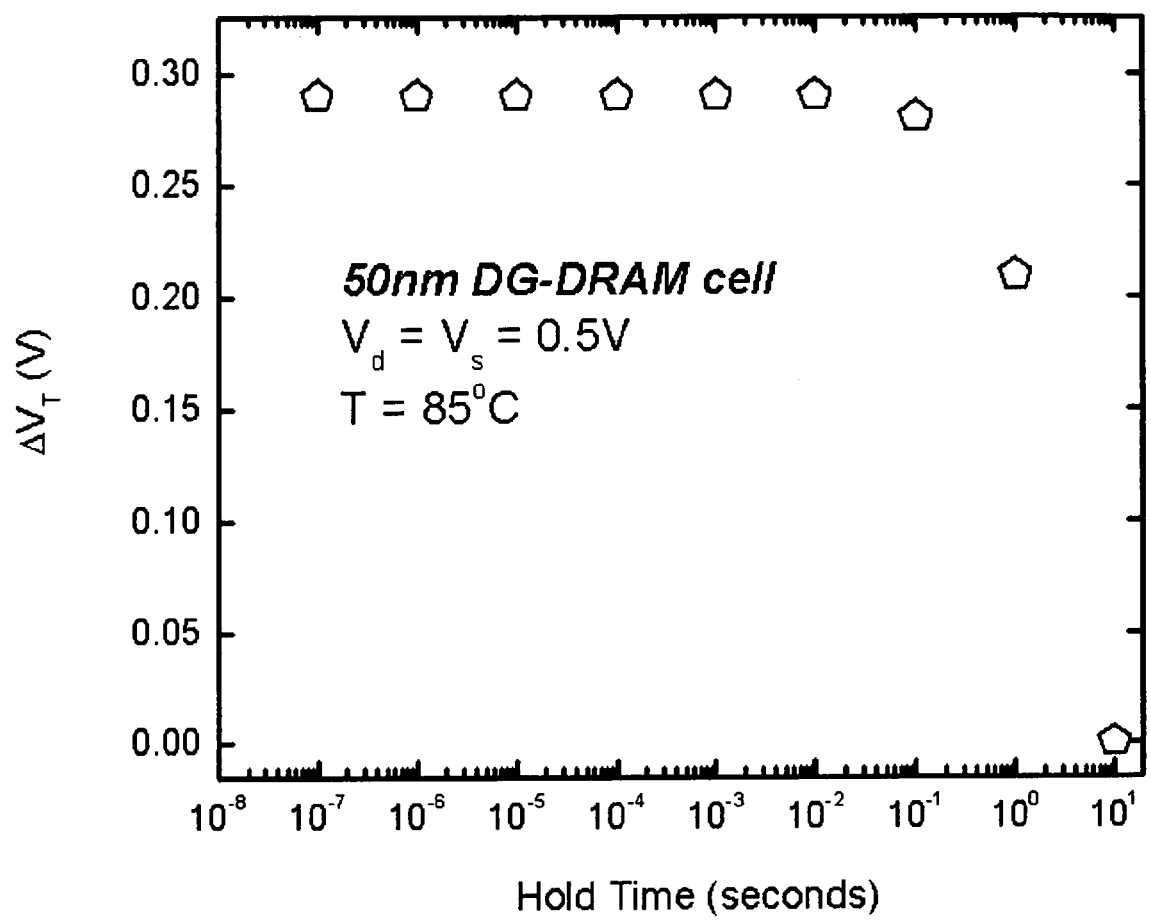
FIG. 7 illustrates example $V_T$ differences between two states during a hold operation for an example DG-DRAM cell according to specific embodiments of the present invention.
Figure 8:
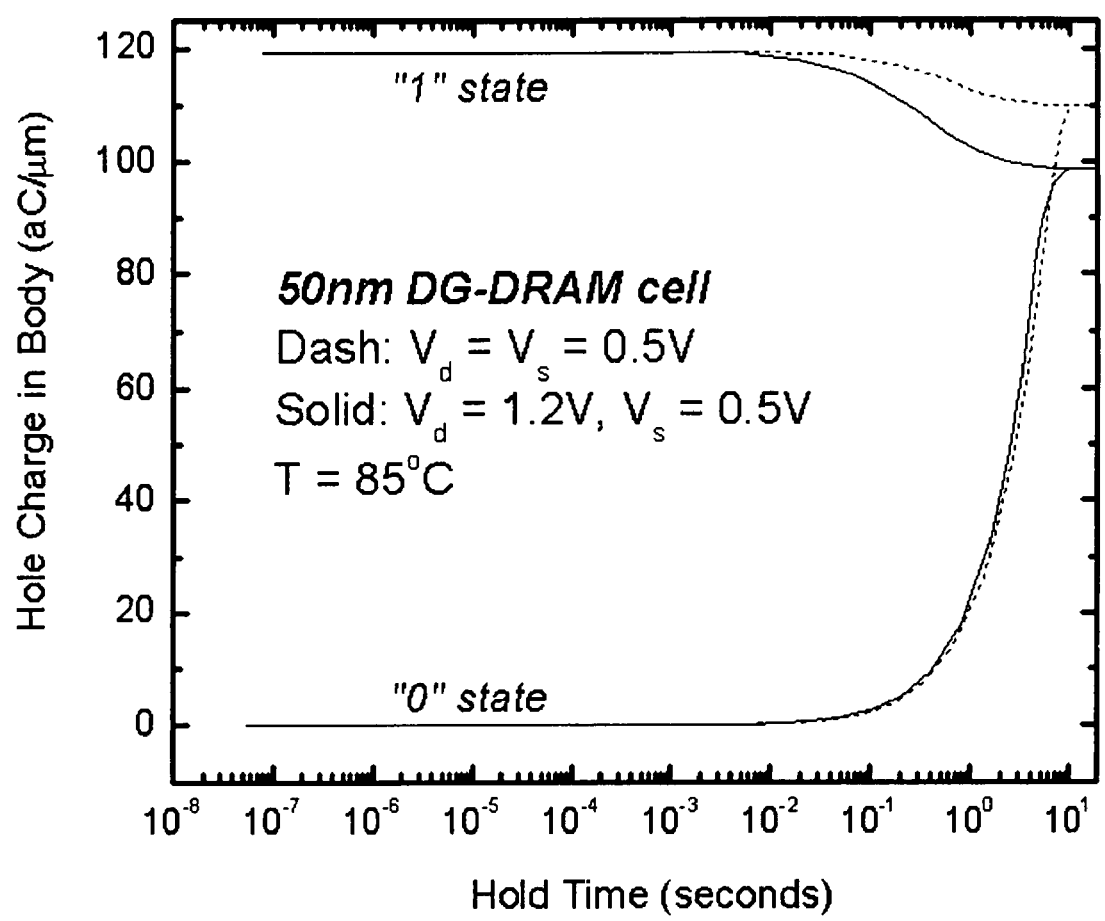
FIG. 8 illustrates example simulated retention characteristics under hold (dash) and disturb (solid) conditions for an example DG-DRAM cell showing that only a small number of holes is needed to distinguish two states according to specific embodiments of the present invention.

Hold characteristics are important parameters of many memory designs. According to specific embodiments of the present invention, the hold characteristics of a cell according to specific embodiments of the present invention are analyzed according to different memory states and affect the design of purge and refresh operations. FIG. 7 illustrates example $V_T$ differences between two states during a hold operation for an example DG-DRAM cell according to specific embodiments of the present invention. FIG. 8 illustrates example simulated retention characteristics under hold (dash) and disturb (solid) conditions for an example DG-DRAM cell showing that only a small number of holes is needed to distinguish two states according to specific embodiments of the present invention.

i. Sustaining a "1" state: In particular implementations, holes introduced into the body are stored within a potential well created by the negative back gate bias. A P+ back gate allows a smaller $|V_{gb}|$ to be used because of its large workfunction, though other conducting back-gate materials, such as a metal, can be used. Small amounts of holes are retained for a long time while larger amounts leak out more quickly because of the stronger forward bias. Holes can also enter the body mostly by thermal generation and level off when this amount is balanced by the number of holes leaving through the junctions.

ii. Sustaining a "0" state: According to specific embodiments of the present invention, holes are removed periodically by a purge step. Over time, however, holes collect in the body. Thermally generated holes are accumulated at a rate determined by the generation lifetime. Thus, materials with larger lifetimes are generally preferred. Holes can also be introduced by band-to-band tunneling. In the vertical direction, band bending never exceeds $E_{g,Si}$ for the hold conditions listed in FIG. 4. In the lateral direction, however, valence band electrons in the body can line up against vacant states in the S/D. This indicates that lateral band-to-band tunneling is the more significant tunneling component. As a result, reducing electric fields at the junctions for a hold operation is necessary to insure that holes within the body come mainly from thermal generation. Graded junctions and a graded back gate oxide formed by a reoxidation step in specific embodiments as will be understood in the art can be used to decrease the fields. In practice, defects in tail bits enhance trap-assisted tunneling currents, implying that small voltages are generally preferable to reduce the electric field at the junctions. Retention time according to specific embodiments of the present invention is generally limited by the ability to sustain a "0" state and consequently, approaches in specific embodiments that reduce thermal generation and band-to-band tunneling would increase retention times.

iii. Disturbs: Disturbs in specific embodiments occur generally when $V_{ds} > 0$, which in operation can happen when a bitline switches to a larger voltage while programming a cell along another wordline. The degree of disturb depends generally on oxide/body thicknesses, operating voltages, and whether the disturb is for a "1" or "0" state.

For a "1" state, static disturbs occur when holes diffuse into the source and electrons entering the body recombine with holes at the back interface. A positive source voltage and thin body decrease drain-induced barrier lowering (DIBL) and minimize these disturb effects. Electron-hole generation/recombination and hole diffusion into the source continue until steady state conditions are reached, as may be further understood from K. Hui, M. Chan, F. Assaderaghi, C. Hu, and P. K. Ko, "Body Self Bias in Fully Depleted and Non-Fully Depleted SOI Devices", *IEEE International SOI Conference Proceedings,* 1994, pp. 65-6. A similar analysis applies to disturbs of a "0" state. Thermal generation and band-to-band tunneling incurred when $V_{ds} > 0V$ result in more holes in the body. However, these effects occur more slowly than the disturbs for a "1" state.

In actual array operations, disturbs occur periodically. First, a disturb occurs when a row is programmed during the refresh time. After programming, $V_{ds}$ across all bits in the subarray block returns to 0V for the remaining refresh interval. When the refresh interval elapses, a new refresh cycle begins. This process repeats until the rows in the entire block are refreshed.

For the "0" state, thermal generation and band-to-band tunneling occur independently of the transient nature of the disturb. For a "1" state, however, dynamic disturbs can happen in two ways. First, holes may diffuse from the body to the source because of DIBL. However, holes accumulate along the back interface where the source-body potential barrier is kept high by (in some embodiments) a P+ back gate workfunction and a negative back gate bias. Away from this interface, the potential barrier becomes smaller and permits more electrons to enter the body through DIBL. Electrons introduced into the body in this manner can recombine with holes at the back interface, resulting in a second type of dynamic disturb. Programming events are expected to occur in less than 100 ns depending on the setup and programming times. Thus, materials with larger recombination lifetimes are less susceptible to this kind of dynamic disturb since electrons introduced into the body do not recombine at a significant rate with the stored holes. When the dynamic disturb elapses, these electrons can leave the body without recombining.

(Because a number of cells may share the source nodes in a particular embodiment, programming disturbs are also possible for a "1" state when the source line is grounded to program cells in adjacent rows. In simulations, this effect is negligible because of the small disturb times (<100 ns) and the fact that the cells are disturbed only once when the adjacent wordline is programmed.)

7. Other Characteristics

Soft Errors

Soft-errors in memory cells are believed primarily to be a result of incident particles from two sources: the decay of alpha particles from packaging materials and the production of neutrons from cosmic rays. In particular memory devices according to specific embodiments of the present invention, penetration of alpha particles are suppressed by a protective polyimide layer over the die as is generally known in the art. However, shielding against high energy incident neutrons is generally believed in the art not to be effective. Fortunately, in typical applications, most cosmic ray neutrons will go through a DRAM without any collisions in the silicon lattice. But if a neutron does strike a silicon atom within the lattice, then electron/hole pairs created in the ionization wake of a charged recoil nucleus can deposit ~160 fC for every micron of penetration into the silicon substrate. This is enough to generate a soft error upset by a direct hit of an incident neutron with a conventional 1T/1C cell's storage node since the charge in the storage capacitor is less than 50 fC. Even for reduced junction areas, a direct hit can result in an error because of the cell's small storage charge. These factors may be further understood with reference to K. Itoh, *VLSI Memory Chip Design*, Springer, New York, 2001.

In a planar DG-DRAM cell, according to specific embodiments of the present invention, however, no charges are collected by a cell from the underlying substrate because of the back gate oxide (e.g., 22 shown in FIG. 2). As in current conventional 1T/1C DRAM, soft errors can occur when there is a direct hit between neutrons and cells in DG-DRAM. But the incident high energy neutron flux is small (~25/cm² hr at sea level), as may be further understood by reference to W. R. McKee, H. P. McAdams, E. B. Smith, J. W. McPherson, J. W. Janzen, J. C. Ondrusek, A. E. Hyslop, D. E. Russell, R. A. Coy, D. W. Bergman, N. Q. Nguyen, T. J. Aton, L. W. Block, and V. C. Huynh, "Cosmic Ray Neutron Induced Upsets as a Major Contributor to the Soft Error Rate of Current and Future Generation DRAMs", IRPS, 1996, pp. 1-6. The small flux and array cell size indicates that the soft error rate in DG-DRAM will be no worse than for 1T/1C DRAM. To compensate for single-bit errors, error checking and correction (ECC) techniques are used according to specific embodiments of the present invention. Without ECC, soft errors will occur in both conventional 1T/1C DRAM and DG-DRAM since neither memory style stores enough charge to withstand a soft error caused by incident high energy neutrons. While there is an overhead associated with extra ECC bits, the ratio of ECC to data bits reduces exponentially for wider internal bus widths, as may be further understood from R. W. Hamming, "Error Detecting and Error Correcting Codes", *The Bell System Technical Journal*, April 1950, pp. 147-60. Such a technique is employed according to specific embodiments of the present invention as may be further understood from reference to H. Kalter, C. Stapper, J. Barth, J. DiLorenzo, C. Drake, J. Fifield, G. Kelley, S. Lewis, W. Vanderhoeven, J. Yankosky, "A 50 ns 16 Mb DRAM with a 10 ns Data Rate and On-Chip ECC", *Journal of Solid State Circuits*, October 1990, pp. 1118-27, and T. Tanzawa, V. Tanaka, K. Takeuchi, R. Shirota, S. Antoine, H. Watanabe, G. Hemink, K. Shimizu, S. Sato, Y. Takeuchi, K. Ohuchi, "A Compact On-Chip ECC for Low Cost Flash Memories", *Journal of Solid State Circuits*, vol. 32, no. 5, pp. 662-9.

Tail Bits

Retention times in DRAM arrays are generally limited by tail bits, e.g., cells in the array that have the shortest retention time. The sources of tail bits in various processes are not always precisely understood, but they are believed to be related to process-induced defects. Thus, steps taken to minimize leakage surrounding the storage node would result in higher retention times. For example, reducing electric fields at the source-body junction minimizes trap-assisted tunneling currents and improves the tail bit distribution.

Deep-level traps occurring within the junction depletion regions can be caused by the S/D implantation. To minimize this effect, in specific embodiments, the implant is adjusted so that its peak ($R_p$) is located within the raised S/D regions and away from the channel. As a result, the damage associated with nuclear stopping at $R_p$ is situated far from the junction edge after the drive-in diffusion for the S/D. Defects also occur within SOI films. However, high quality SOI wafers can potentially have carrier lifetimes of up to 100 μs, as described in D. Munteanu, D. A. Weiser, S. Cristoloveanu, O. Faynot, J.-L. Pelloie, J. G. Fossum, "Generation-Recombination Transient Effects in Partially Depleted SOI Transistors: Systematic Experiments and Simulations", *IEEE Transactions on Electron Devices*, August 1998, pp. 1678-83. To reduce the density of surface states at the back interface, bonded wafers with a thermally oxidized surface may be preferred.

8. Other Fabrication Embodiments of the Invention

Recrystallization

DG-DRAM cells according to further embodiments can be fabricated using deposited noncrystalline material such as amorphous silicon. Silicon bodies of good quality may be created for each DG-DRAM cell through various recrystallization techniques, such as described in V. Subramanian and K. Saraswat, "High-Performance Germanium-Seeded Laterally Crystallized TFT's for Vertical Device Integration", *Transactions on Electron Devices*, September 1998, pp. 1934-9 and N. Yamauchi and R. Reif, "Polycrystalline Silicon Thin Films Process with Silicon Ion Implantation and Subsequent Solid-Phase Recrystallization: Theory, Experiments, and Thin-Film Transistor Applications", *Journal of Applied Physics*, Apr. 1, 1994, pp. 3235-3257. Using initially deposited noncrystalline materials in DG-DRAM can have practical applications in extending DG-DRAM technology to 3-D applications in order to increase the memory density and reduce the cost per bit.

Alternative Materials

Generally, in DG-DRAM and similar cells, retention times are limited by the accumulation of holes in the body. The hole generation rate is proportional to the parameter $n_i$. In silicon, $n_i=10^{10}$ cm$^{-3}$ at room temperature, but decreases exponentially for materials with larger bandgaps. As a result, in further embodiments it is believed the invention can be constructed using a large bandgap, CMOS-compatible material such as silicon carbide (SiC) as the body material. This would reduce the generation rate and increase the retention times over DG- DRAM cells made exclusively with conventional silicon materials. A larger bandgap also raises the potential barrier between the body and S/D at steady state, allowing more holes to be stored in the body for a "1" state. As a result, the $V_t$ difference between the two states can be larger.

To compensate for the smaller impact ionization rate resulting from a larger bandgap, it is possible to use two materials in the body, e.g. an SiC layer at the back interface, while a thinner silicon capping layer is used at the front interface. This permits impact ionization to remain large enough for nanosecond-scale programming while sustaining larger retention times by using a large bandgap material elsewhere in the body.

Static Back Gate Bias Using a Single P+ Layer

In specific embodiments as described herein, a static back gate bias can be used for purge. With such an operation, it is not necessary to create separate wordlines in a memory array and/or subarray block for the back gate of each memory cell. As a result, a single P+ layer or other backgate material which covers the entire subarray block may be used since the back gate voltage is the same for all the cells and this can simplify memory device construction. Moreover, conventional SOI wafers with a small buried oxide thickness can be used to fabricate DG-DRAM devices.

9. Experimental and Characterization Data

In experimental and characterization work related to specific embodiments of the invention, Recessed Channel SOI (RCSOI) MOSFETs can be used as test vehicles for experimental measurements of various asymmetric DG-DRAM cells according to specific embodiments of the present invention. Further details regarding RCSOI MOSFETs may be found in M. Chan, F. Assaderaghi, F., S. A. Parke, S. S. Yuen, C. Hu, and P. Ko, "Recessed Channel Structure for Fabricating Ultrathin SOI MOSFET with Low Series Resistance", *IEEE Electron Device letters*, January 1994, pp. 22-4.

Figure 9:
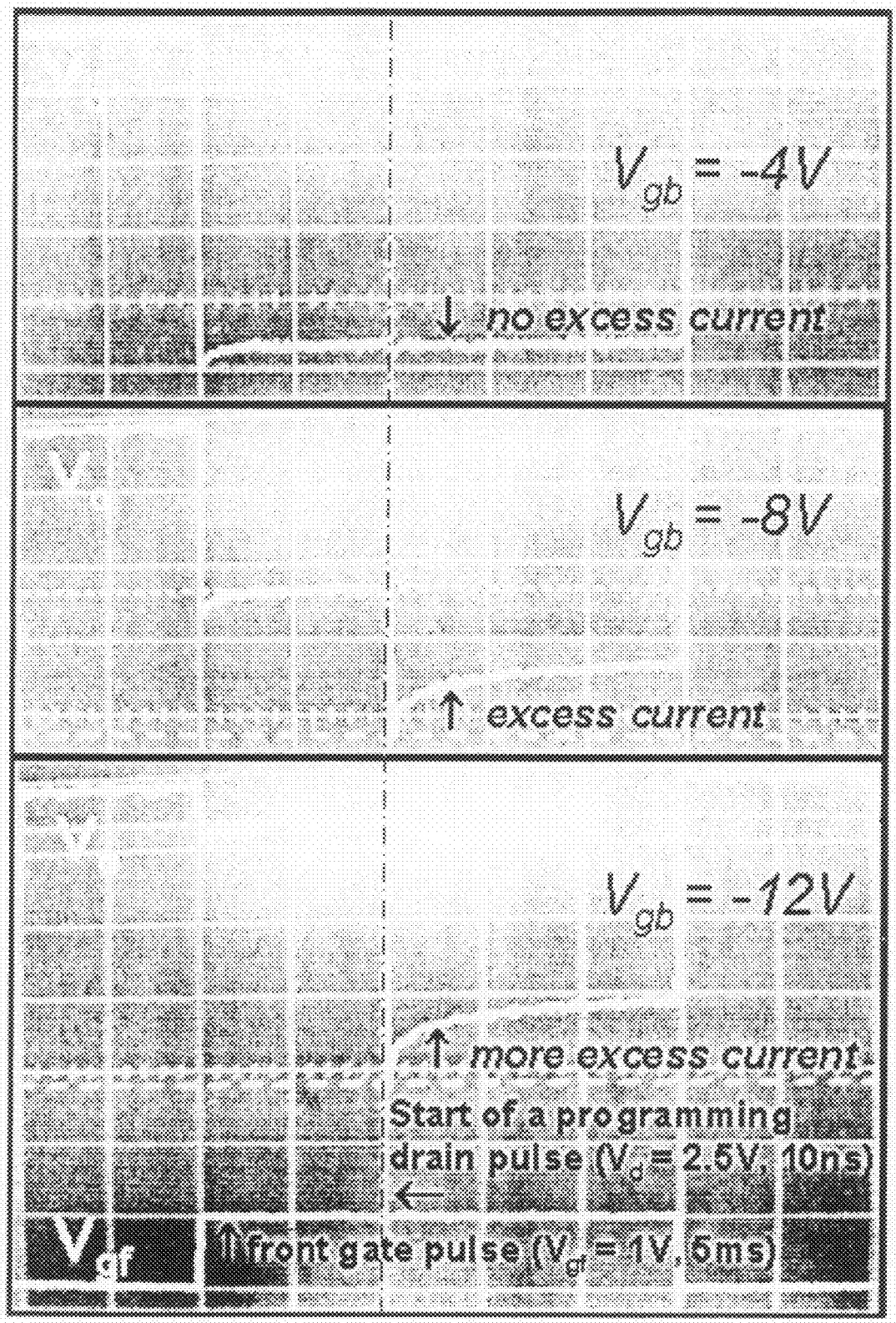
FIG. 9 illustrates experimental operation results showing that a larger $|V_{gb}|$ raises excess current using an experimental recessed-channel SOI (RCSOI) NMOSFET device with operation methods that are similar in some respects, but differ qualitatively in some places (e.g. the hold state) and use voltages that are quantitatively different, from devices according to specific embodiments of the present invention.
Figure 10:
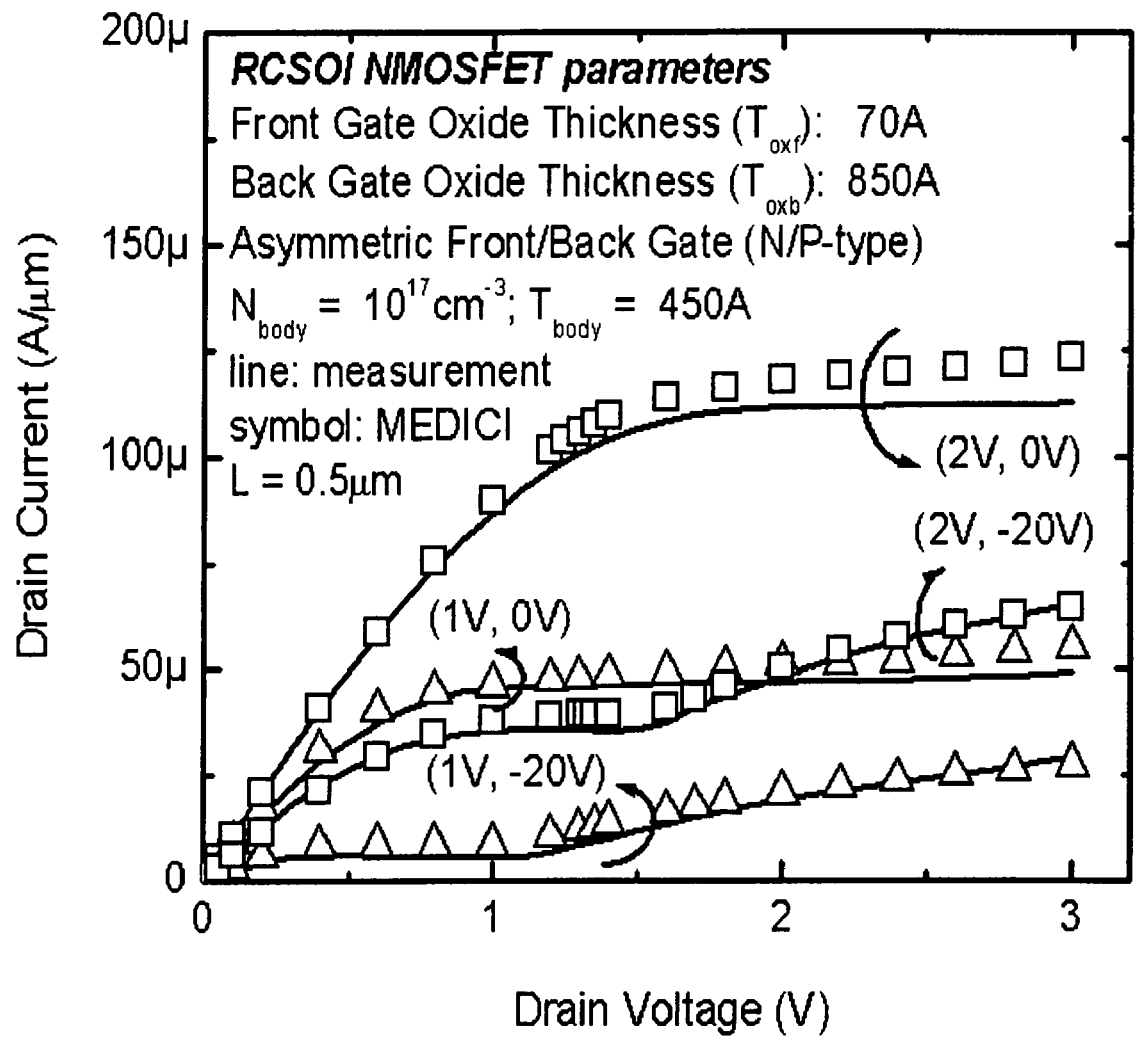
FIG. 10 illustrates that the appearance of a kink effect in fully depleted SOI NMOSFETs depends on the front and back gate voltages ($V_{gf}$, $V_{gb}$) as demonstrated using an experimental RC SOI NMOSFET device (with voltages appropriate for that particular device and possibly different from actual devices built according to the invention).

In a particular set of experiments, the front gate of such an RCSOI device is N-type while the P-type substrate acts as a back gate. A pulsing method used to measure RCSOI devices uses a 50 ns purge pulse to expel holes. Program and read pulses follow at the front gate. The programming drain pulse is set at 10 ns. RCSOI devices used to test operating modes were fabricated on a SIMOX wafer and have a small generation lifetime of ~100 ns. Like the 50 nm DG-DRAM simulations, steady-state characteristics are exhibited in the RCSOI measurements. Likewise, retention times are limited by the accumulation of holes in the body. FIG. 9 illustrates experimental operation results showing that a larger $|V_{gb}|$ raises excess current using an experimental recessed-channel SOI (RCSOI) NMOSFET device with operation methods that are similar in some respects, but differ qualitatively in some places (e.g. the hold state) and use voltages that are quantitatively different, from devices according to specific embodiments of the present invention. In this particular example characterization, W/L=20 µm/0.3 µm; $V_o$: 500 mV/div; $V_{gf}$: 1 V/div; time: 1 ms/div; R=1.1 kohm. In this figure, $V_o$ can be understood as representing the output voltage of an example transimpedance amplifier used in an experimental setup. FIG. 10 illustrates that the appearance of a kink effect in fully depleted SOI NMOSFETs depends on the front and back gate voltages ($V_{gf}$, $V_{gb}$) as demonstrated using an experimental RC SOI NMOSFET device (with voltages appropriate for that particular device and possibly different from actual devices built according to the invention).

A larger generation lifetime and back gate capacitance ($C_{oxb}$) would improve the retention characteristics of the RCSOI device. Increasing lifetimes and $C_{oxb}$ require higher quality silicon films and a thinner back gate oxide respectively. By increasing the back gate capacitance, the impact of accumulated holes on $V_t$ over time is minimized by a smaller change in body potential. However, the back gate oxide cannot be thinned excessively because of considerations with overlap capacitance, thickness variations on $V_t$, programming speeds for a "1" state, and electric fields at the junctions.

System Embodiments

Use of the Storage Device in Computer Systems

Figure 11:
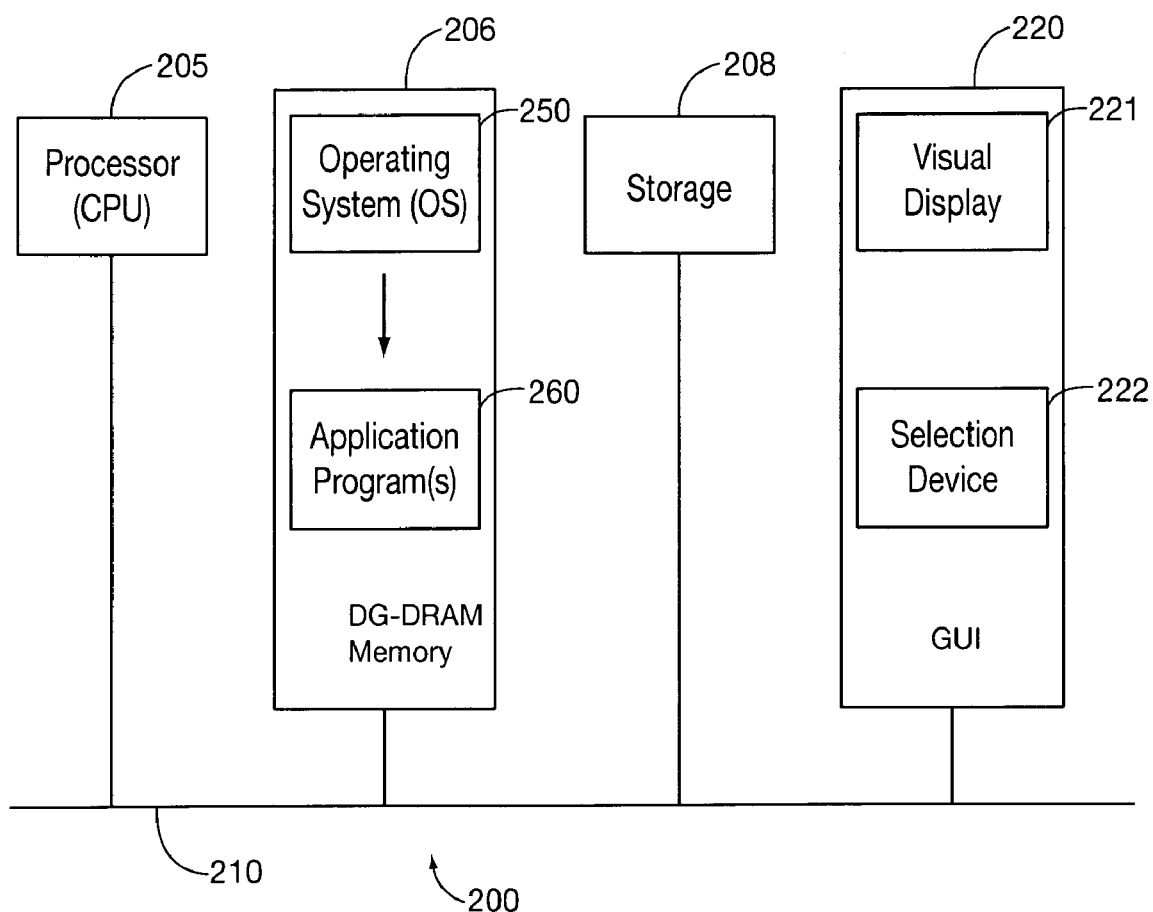
FIG. 11 is a block diagram showing an example digital system architecture in which various aspects of the present invention may be embodied.

The use of the storage devices of this invention in information systems is contemplated. One such system is illustrated in FIG. 11. The computer comprises a signal source (e.g. I/O device or CPU) a storage device of this invention and appropriate circuitry (e.g. voltammetry circuitry) to read the state (s) of the storage device. In operation, voltages representing the bits to be stored are applied to the working electrodes of the storage device thereby setting the memory. When retrieval is necessary (e.g. for output, or further processing) the state(s) of the storage device is read by the I/O circuitry and the information is passed off to other elements (e.g. CPU) in the computer. FIG. 11 illustrates an example of memory devices according to specific embodiments of the present invention integrated into an information system 200. The hardware of system 200 includes a processor (CPU) 205, a working memory 206 (which can entirely or partially comprise DG-DRAM memory devices according to specific embodiments of the present invention), an optional persistent storage 208, and hardware for a graphical user interface (GUI) 220, coupled by a local bus or interface 210. System 200 can further include additional hardware components (not shown). Operation and examples of such systems are well-known in the art and persons of skill in the art will appreciate that a wide range of hardware and software configurations can support the system and method of the present invention in various specific embodiments.

The invention also may be embodied in whole or in part within the circuitry of an application specific integrated circuit (ASIC) or a programmable logic device (PLD) or may be embodied in whole or in part as instructions for fabricating and/or laying out a device according to the teachings herein. In such a case, the invention may be embodied in a computer understandable descriptor language, such as RTL or other appropriate layout language, which may be used to create an integrated circuit device that operates as herein described.

One particular advantage of specific embodiments of the present invention is that a memory based on one or more cells of the present invention can store data at a relatively high density. Thus, the present invention can be embodied in an electronic device that is smaller that an analogous device not using memory according to specific embodiments of the present invention. Such devices can include, but are not limited to, portable computers, hand-held devices such as personal digital assistants, or cellular phones. The present invention, when embodied in such devices, allows for inclusion of substantially more memory in small electronic devices.

Other Embodiments

The invention has now been described with reference to specific embodiments. Other embodiments will be apparent to those of skill in the art. In particular, a DG-DRAM cell has generally been illustrated and described with reference with a particular and straight-forward transistor layout. However, it will be apparent to those of skill in the art that the methods of operation and/or fabrication of DG-DRAM devices as described herein can be employed in a variety of different device layouts, including all manner of solid state memory architectures that allow for use of a double gate and other architectures. Thus, although the present invention has been described in terms of various specific embodiments, it is not intended that the invention be limited to these embodiments. Modification within the spirit of the invention will be apparent to those skilled in the art. It is understood that the examples and embodiments described herein are for illustrative purposes and that various modifications or changes in light thereof will be suggested by the teachings herein to persons skilled in the art and are to be included within the spirit and purview of this application and scope of the claims.

All publications, patents, and patent applications cited herein or filed with this application, including any references filed as part of an Information Disclosure Statement, are incorporated by reference in their entirety.

What is claimed:

1. A method of operating an electronic memory circuit comprising:
    attracting charge carriers onto a back interface of a body by applying a voltage to a back gate;
    detecting a number of charge carriers at said back interface by measuring a drain current; and
    using said measured drain current to determine a value stored on said electronic memory circuit; and,
    placing said memory circuit in a hold state by applying a first hold gate voltage to said front gate and a second hold gate voltage to said back gate and applying nearly equal voltages to said source and said drain.

2. A method of operating an electronic memory circuit comprising:
    attracting charge carriers onto a back interface of a body by applying a voltage to a back gate;
    detecting a number of charge carriers at said back interface by measuring a drain current; and
    using said measured drain current to determine a value stored on said electronic memory circuit; and,
    periodically performing a purge of excess carriers in a body by applying a first purge gate voltage to said front gate and a second purge voltage to said back gate and applying purge voltages to said source and said drain.

3. A method of operating an electronic memory circuit comprising:
    attracting charge carriers onto a back interface of a body by applying a voltage to a back gate;
    detecting a number of charge carriers at said back interface by measuring a drain current; and
    using said measured drain current to determine a value stored on said electronic memory circuit; and,
        a write is performed by a front gate write voltage, a back gate write voltage substantially different from said front gate write voltage, and a drain-source voltage less than or greater than a critical value for impact ionization ($\sim E_{gap,Si}/q$), depending on whether a "0" or "1" is desired to be written;
        a hold is performed by a front gate hold voltage different from said front gate write voltage, a back gate hold voltage of about said back gate write voltage, a source hold voltage and a drain hold voltage biased at a same hold voltage;
        a read is performed by a front gate read voltage of about said front gate write voltage, a back read gate voltage substantially different from said front gate write voltage, a source read voltage about between said front gate read voltage and said back gate read voltage, and a drain voltage somewhat different from said source read voltage and less than a critical value for impact ionization; and a purge is performed by a front gate purge voltage of about said front gate write voltage, a back gate purge voltage nearer to said front gate purge voltage than said back gate write voltage, a source purge voltage of about said back gate purge voltage or about ground, and a drain voltage about between said source purge voltage and said back gate purge voltage.

4. A method of operating an electronic memory circuit comprising:
    attracting charge carriers onto a back interface of a body by applying a voltage to a back gate;
    detecting a number of charge carriers at said back interface by measuring a drain current; and
    using said measured drain current to determine a value stored on said electronic memory circuit; and,
    periodically performing a static purge of said back interface.

5. The method of claim 4 further wherein said static purge is performed by a method comprising:
    holding a voltage at said back interface unchanged throughout all operation modes of said memory circuit;
    during said static purge, changing a front gate voltage to a positive value to reduce a potential barrier between source and body.

6. The method of claim 5 further comprising:
    grounding a source voltage to further reduce said a potential barrier between source and body.

7. The method of claim 5 further comprising:
    in an array comprising multiple instances of said memory circuit:
    keeping one block of said multiple instances of said memory circuit vacant;
    copying data from a non-vacant block into said vacant block;
    performing a purge on all memory circuits in said non-vacant block which then becomes a vacant block for a next static purge operation.

8. A method of operating an electronic memory circuit comprising:
    attracting charge carriers onto a back interface of a body by applying a voltage to a back gate;
    detecting a number of charge carriers at said back interface by measuring a drain current; and
    using said measured drain current to determine a value stored on said electronic memory circuit;
        a back gate voltage is held constant and substantially different from a front gate write voltage;
        a write is performed by a front gate write voltage, and a drain-source voltage less than or greater than a critical value for impact ionization ($\sim E_{gap,Si}/q$), depending on whether a "0" or "1" is desired to be written;
        a hold is performed by a front gate hold voltage different from said front gate write voltage, a source hold voltage and a drain hold voltage biased between said front gate hold voltage and said back gate voltage;
        a read is performed by a front gate read voltage of about said front gate write voltage, a source read voltage between said front gate read voltage and said back voltage, and a drain voltage somewhat different from said source read voltage and less than a critical value for impact ionization; and
    a static purge is performed by reducing a potential barrier between source and body regions of said memory cell.

9. A method of operating an electronic memory circuit comprising:
- attracting charge carriers onto a back interface of a body by applying a voltage to a back gate;
- detecting a number of charge carriers at said back interface by measuring a drain current; and
- using said measured drain current to determine a value stored on said electronic memory circuit;
  - a write is performed by a front gate voltage of about 1 V, a back gate voltage of about −1 V, a source voltage of about 0 V, and a drain voltage of about 0.5 V or 1.2 V depending on the desired write value;
  - a hold is performed by a front gate voltage of about 0 V, a back gate voltage of about −1 V a source voltage of about 0.5 V, and a drain voltage of about 0.5 V;
  - a read is performed by a front gate voltage of about 1 V, a back gate voltage of about −1 V, a source voltage of about 0 V, and a drain voltage of about 0.5 V; and
- a purge is performed by a front gate voltage of about 1 V, a back gate voltage of about 1 V, a source voltage of about 0 V, and a drain voltage of about 0.5 V.

* * * * *